US008280657B2

(12) United States Patent
Van Gorp et al.

(10) Patent No.: US 8,280,657 B2
(45) Date of Patent: Oct. 2, 2012

(54) UTILITY MONITORING SYSTEM WITH VARIABLE LOGGING

(75) Inventors: John C. Van Gorp, Sidney (CA); Marcus Gasper, Salt Spring Island (CA); Steven B. Raffo, Victoria (CA)

(73) Assignee: Schneider Electric USA, Inc., Palatine, IL (US)

( * ) Notice: Subject to any disclaimer, the term of this patent is extended or adjusted under 35 U.S.C. 154(b) by 571 days.

(21) Appl. No.: 12/351,526

(22) Filed: Jan. 9, 2009

(65) Prior Publication Data

US 2010/0179776 A1    Jul. 15, 2010

(51) Int. Cl.
*G01R 21/00* (2006.01)
*G01R 11/56* (2006.01)
(52) U.S. Cl. .......................................... 702/61; 705/412
(58) Field of Classification Search ................... 702/61, 702/57, 60, 62, 64–65, 79–80, 81, 84, 127, 702/176, 182–183, 187–189; 361/601, 641, 361/659–661; 700/286, 291, 296; 705/412; 715/772
See application file for complete search history.

(56) References Cited

U.S. PATENT DOCUMENTS

2004/0225625 A1* 11/2004 Van Gorp et al. ............. 705/412

OTHER PUBLICATIONS

3720 ACM Installation and Operation Manual, Section 8.4.3, Power Measurement, Canada, Feb. 1, 2005 (4 pages).

* cited by examiner

*Primary Examiner* — Toan M Le
(74) *Attorney, Agent, or Firm* — Nixon Peabody LLP

(57) ABSTRACT

A method of storing data in a utility monitoring system includes monitoring a characteristic of a utility system in an intelligent electronic device (IED) to produce monitored characteristic values that are buffered in the IED. The IED is communicatively coupled to a server via a network. The monitored characteristic values are indicative of the characteristic. The method further includes storing a first monitored characteristic value of the buffered monitored characteristic values periodically at a first logging interval in a memory of the IED. The method further includes storing a second monitored characteristic value of the buffered monitored characteristic values periodically at a second logging interval in the memory of the IED in response to satisfying a criterion. The second logging interval is distinct from the first logging interval.

24 Claims, 5 Drawing Sheets

UTILITY MONITORING SYSTEM WITH VARIABLE LOGGING

FIELD OF THE INVENTION

The present invention relates generally to utility monitoring systems and in particular, to utility monitoring systems with variable logging intervals.

BACKGROUND OF THE INVENTION

Utility systems, such as an electrical utility system, are monitored by a network of intelligent electronic devices ("IEDs") coupled to a computer and/or server for monitoring various parameters or characteristics of the electrical utility system. The network of IEDs and the computer are typically referred to collectively as a power monitoring system. The power monitoring systems can include between one to several thousand networked IEDs communicatively coupled to the computer. Managing data generated in the IEDs presents data management issues, such as data storage within the IEDs and bandwidth for transmitting data from the IEDs to the computer. Depending on the frequency that data is logged by each of the networked IEDs, the demands on resources of the power monitoring system vary. Power monitoring systems that require IEDs with larger storage capacity and networks with larger bandwidth cost more to setup and maintain, which results in an overall higher total cost of ownership.

Thus, a need exists for an improved apparatus and method. The present invention is directed to satisfying one or more of these needs and solving other problems.

SUMMARY OF THE INVENTION

The present invention provides a solution that allows a utility monitoring system to store a sufficient amount of data during events of interest. The data is transmitted from a plurality of IEDs to a server utilizing a minimum or reduced amount of bandwidth prior to having to overwrite the data in the IEDs. The present invention provides methods for varying a logging interval of monitored characteristic values. The varied logging intervals allow IEDs to monitor a characteristic or parameter and store a sufficient amount of monitored characteristic values and/or associated information for later use in analyzing the monitored characteristic during normal operation or during an event of interest. The varied logging intervals increase based on a satisfaction of a condition to maximize the power monitoring system's resources such that monitored characteristic values being logged with an increased frequency (i.e., shorter logging interval) is during events of interest and that monitored characteristic values being logged during normal operation or non-events of interest is logged with a decreased frequency (i.e., longer logging interval).

According to some embodiments, a method of storing data in a utility monitoring system includes monitoring a characteristic of a utility system in an intelligent electronic device (IED) to produce monitored characteristic values that are buffered in the IED. The IED is communicatively coupled to a server via a network. The monitored characteristic values are indicative of the characteristic. The method further includes storing a first monitored characteristic value (e.g., one of the buffered monitored characteristic values in the logging interval under consideration) of the buffered monitored characteristic values periodically at a first logging interval in a memory of the IED. The method further includes storing a second monitored characteristic value of the buffered monitored characteristic values periodically at a second logging interval in the memory of the IED in response to satisfying a criterion. The second logging interval is distinct from the first logging interval.

According to some embodiments, a method of displaying data periodically stored at variable logging intervals includes monitoring a characteristic of a utility system in an IED to produce monitored characteristic values periodically at a monitoring interval. The produced monitored characteristic values are buffered in the IED. The IED is communicatively coupled to a server via a network. The monitored characteristic values are indicative of the characteristic. The method further includes storing a first monitored characteristic value of the monitored characteristic values periodically at a first logging interval in a memory of the IED and storing a second monitored characteristic value of the monitored characteristic values periodically at a second logging interval in the memory of the IED in response to satisfying a criterion. The second logging interval is distinct from the first logging interval. The method further includes transmitting the stored monitored characteristic values to the server over the network and displaying a graphical representation of the stored monitored characteristic values at a fixed interval of time.

According to some embodiments, a method of logging data in a utility monitoring system includes monitoring a characteristic of a utility system in an IED to produce monitored characteristic values that are buffered in the IED. The monitored characteristic values are indicative of the characteristic. The method furthering includes storing first monitored data periodically at a first logging interval in a memory of the IED. The first monitored data is associated with the buffered monitored characteristic values. The method further includes storing second monitored data periodically at a second logging interval in the memory of the IED in response to satisfying a criterion. The second monitored data is associated with the buffered monitored characteristic values. The second logging interval is distinct from the first logging interval.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

DETAILED DESCRIPTION OF THE ILLUSTRATED EMBODIMENTS

Although the invention will be described in connection with certain aspects and/or embodiments, it will be understood that the invention is not limited to those particular aspects and/or embodiments. On the contrary, the invention is intended to cover all alternatives, modifications, and equivalent arrangements as may be included within the spirit and scope of the invention as defined by the appended claims.

Figure 1:
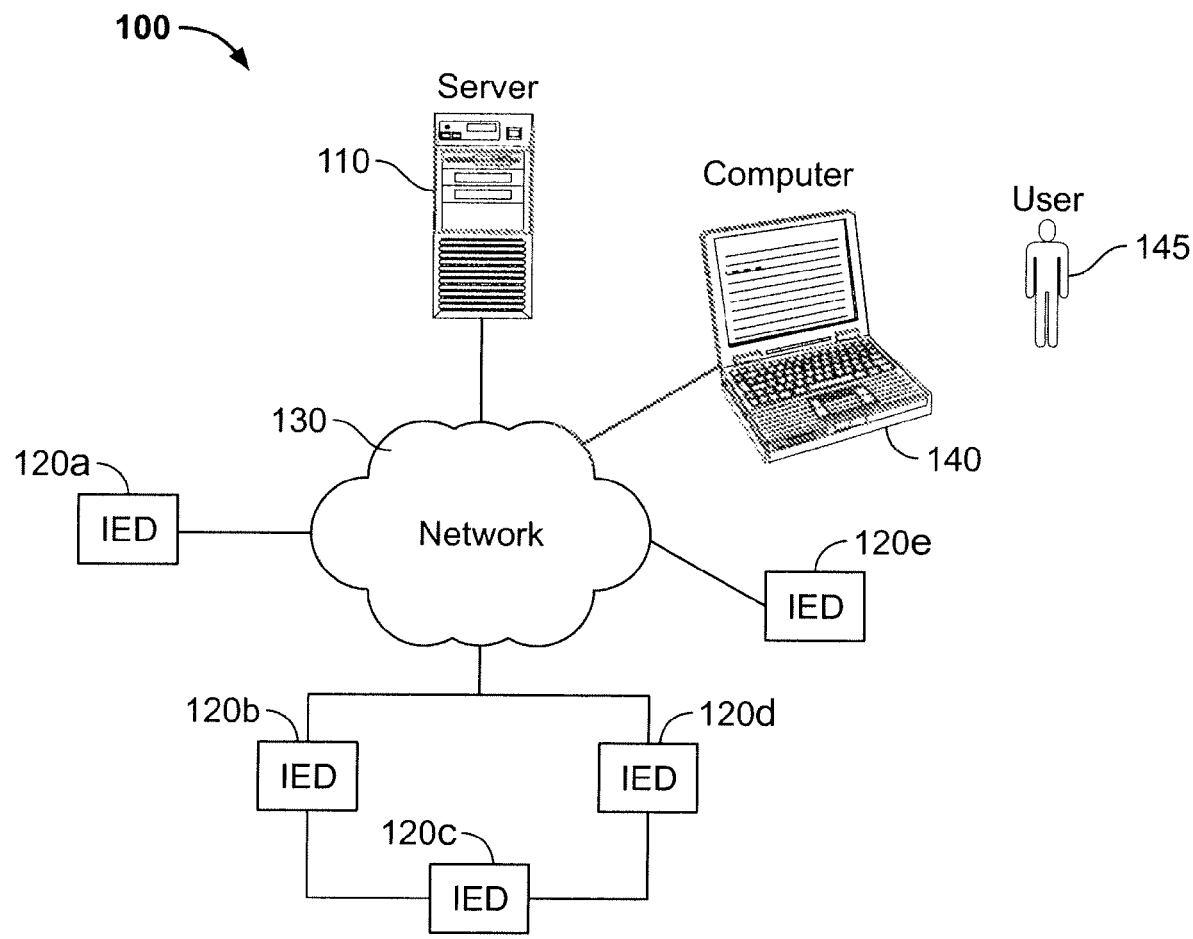
FIG. 1 is a functional block diagram of a utility monitoring system according to some aspects of the present disclosure.

Referring to FIG. 1, a utility monitoring system 100 is generally shown. The utility monitoring system 100 includes a server 110, a plurality of intelligent electronic devices 120a-e (hereafter "IEDs"), a network 130, and a computer 140. The IEDs 120a-e are communicatively coupled through the network 130 to the server 110 and the computer 140. As used herein, an IED refers to any system element or apparatus with the ability to sample, collect, or measure one or more operational characteristics or parameters of a utility system. The utility system being monitored by the utility monitoring system 100 can be any of the five utilities designated by the acronym WAGES, or water, air, gas, electricity, or steam. The utility monitoring system 100 may also monitor emissions related to the WAGES utilities, such as, for example, wastewater and greenhouse gas emissions. In the electrical utility context, the IED may be based on a PowerLogic® Series 3000/4000 Circuit Monitor or a PowerLogic® ION7550/7650 Power and Energy Meter available from Schneider Electric or any other suitable monitoring device (e.g., circuit monitor), a circuit breaker, a relay, a metering device, or a power meter.

The utility monitoring system 100 can be configured to monitor one or more of a plurality of characteristics or parameters of any of the WAGES utilities. For an electrical utility, the utility monitoring system 100 can be configured to monitor electrical characteristics such as, for example, power, voltage, current, current distortion, voltage distortion, and/or energy. For other utilities, the utility monitoring system 100 can be configured to monitor volumetric flow rates, mass flow rates, volumetric flux, mass flux, etc.

For simplicity, the following disclosure will describe the invention in reference to a power monitoring system 100 configured to monitor current, although it is understood that all of the following embodiments and aspects can similarly be applied to monitoring any other electrical characteristic, or any other characteristic of any of the WAGES utilities. Each of the IEDs 120a-e produce monitored characteristic values periodically at a monitoring interval, where the monitored characteristic values are indicative of the characteristic being monitored. Put another way, the IEDs 120a-e monitor current to produce a plurality of current measurements indicative of the current being monitored.

The monitoring interval can be any period or duration of time between producing the monitored characteristic values. For example, the monitoring interval can be one minute, one second, one tenth of a second, etc. For a monitoring interval of one second, the IEDs 120a-e produce a monitored characteristic value (e.g., derived from a current measurement) every second. An IED monitoring current every second may produce a periodic sequence of monitored characteristic values as follows: [99.7 amps, 99.8 amps, 100.2 amps, 100.1 amps, 125 amps]. Each of these current measurements corresponds to a monitored characteristic value produced periodically at consecutive one second intervals. As will be described below in detail, these monitored characteristic values are evaluated, according to some embodiments, as to whether they satisfy a criterion, which affects a logging interval of the monitored characteristic values.

A non-limiting example of how the IEDs 120a-e can be used in practice provides that each of the IEDs 120a-e is a power monitor that monitors different aspects of an electrical utility in a building. The first IED 120a monitors an incoming electrical service to the entire building. The second, third, and fourth IEDs 120b-d monitor different circuits of a common voltage bus within the building. The fifth IED 120e monitors a critical electrical circuit for servers in a server room within the building. Each of the IEDs 120a-e monitors current draw and produce current measurements, that is, monitored characteristic values, periodically at the monitoring interval.

Each of the IEDs 120a-e includes a single memory for buffering the produced monitored characteristic values and for storing a portion of the buffered monitored characteristic values. Alternatively, each of the IEDs 120a-e includes a first memory and a separate buffer second memory. According to some embodiments, the first IED 120a monitors current and produces a monitored characteristic value every sample period. These monitored characteristic values are buffered in the memory at least until a first logging interval is reached. The first logging interval is a predetermined period or duration of time between storing at least one of the monitored characteristic values. According to some embodiments, after reaching the first logging interval, the first IED 120a stores the last monitored characteristic value produced by the first IED 120a and disregards the rest of the monitored characteristic values produced and buffered in the first IED 120a. For example, for a monitoring interval of one second and a first logging interval of five minutes, the last monitored characteristic value is the three hundredth produced monitored characteristic value. The IED 120a periodically produces monitored characteristic values every sample period (e.g., one second is used for simplicity; preferably the sample period is much shorter, for example, 128 samples per second). However, only the three hundredth produced monitored characteristic value corresponds with the five minute first logging interval. Thus, only the three hundredth produced monitored characteristic value is stored in the memory. The last monitored characteristic value is also known as an instantaneous monitored characteristic value. According to some embodiments, disregarding buffered, yet unstored monitored characteristic values can include deleting the monitored characteristic values from the buffer memory or overwriting the monitored characteristic values with subsequently produced monitored characteristic values.

Instead of only storing the last monitored characteristic value in the memory, the first IED 120a can store any one of or any combination of the buffered monitored characteristic values. For example, two or more of the produced monitored characteristic values can be stored in the memory. For a monitoring interval of one second and a first logging interval of five minutes, the first IED 120a can store the one hundredth, the two hundredth, and the three hundredth produced monitored characteristic values. Various other combinations of monitoring intervals, first logging intervals, and numbers of determined monitored characteristic values can be stored in the memory.

Additionally, information associated with the produced monitored characteristic values can be stored in the memory. For example, the first IED 120a can also store an average logging interval characteristic value, a maximum logging interval characteristic value, and/or a minimum logging interval characteristic value in the memory. The average logging interval characteristic value corresponds to an average of the monitored characteristic values produced in the first IED 120a during a particular logging interval (e.g., the first logging interval). For example, for a monitoring interval of one second and a logging interval of one minute, the average logging interval characteristic value is the average value of the 60 one-second monitored characteristic values produced during the one minute first logging interval. The maximum logging interval characteristic value is equal to the monitored characteristic value produced during a particular logging interval having the maximum value (e.g., maximum current measurement). Similarly, the minimum logging interval characteristic value is equal to the monitored characteristic value produced during a particular logging interval having the minimum value (e.g., current measurement).

The amount of memory in each of the IEDs 120a-e must be sufficient to at least buffer all of the produced monitored characteristic values during a particular logging interval. Otherwise, the IEDs 120a-e will overwrite previously stored monitored characteristic values with subsequently produced monitored characteristic values. Such a scenario is undesirable when the IEDs 120a-e are configured to determine and store additional information, such as, for example, the average logging interval characteristic value, the maximum logging interval characteristic value, and/or the minimum logging interval characteristic value. If the IEDs 120a-e were forced to overwrite even a portion of the buffered monitored characteristic values, then such determinations would become impractical. According to some embodiments, the buffered monitored characteristic values are not available to the server 110, the computer 140, or any other device outside the IEDs 120a-e. Moreover, the buffered monitored characteristic values are not produced when the IEDs 120a-e are powered off.

According to some embodiments, the monitored characteristic values and/or associated information stored in the memory of the first IED 120a are transmitted over the network 130 to the server 110 for storage and/or processing. According to some embodiments, the monitored characteristic values and/or associated information stored in the memory of the IEDs 120a-e are transmitted over the network 130 at predetermined intervals. For example, the monitored characteristic values and associated information can be transmitted every hour, every twelve hours, every day, every week, every month. Other transmission schedules with more or less frequency are contemplated depending on the amount of memory in the IEDs 120a-e and the duration of the first logging interval. A user 145 of the computer 140, also known as a workstation, can view the monitored characteristic values on a display and the associated information stored on the server 110. Optionally, the user 145 can connect through the network 130 directly to one or more of the IEDs 120a-e to view on a video display and/or directly download the monitored characteristic values and/or associated information stored on the IEDs 120a-e.

As described above, according to some embodiments, the IEDs 120a-e are configured to store a corresponding one of the monitored characteristic values periodically at the first logging interval. Due to limited memory in the IEDs 120a-e, the first logging interval is a predetermined period or duration of time that typically supplies a summary of the monitored characteristic values produced over a period of time. According to some embodiments, the first logging interval is between about one minute and about sixty minutes. According to some embodiments, the first logging interval is between about five minutes and about twenty minutes. Yet according to some embodiments, the first logging interval is about five minutes (e.g., ±one minute).

In the case of an event of interest occurring in the electrical utility system being monitored by the power monitoring system 100, the first logging interval generally does not supply the user 145 with adequate information for a thorough analysis of the event of interest. Such is the case because the first logging interval is fixed and determined based on (1) the size of the memory in the IEDs in the utility monitoring system and/or (2) the frequency that the stored monitored characteristic values are downloaded and or transmitted to the server 110. Increasing the available memory in the IEDs 120a-e is costly and time consuming, and increasing the frequency of transmitting stored data over the network 130 to the server 110 for long term storage increases the resources needed to operate the power monitoring system 100 and increases the bandwidth consumption over the network 130. In the case of several hundred or several thousand IEDs communicatively coupled to the server 110 via the network 130, increasing the frequency of transmitting stored data, such as the monitored characteristic values, greatly impacts the total cost of ownership of the power monitoring system 100.

Thus, a method of varying the logging interval between the first logging interval and a second logging interval in response to an occurrence of an event of interest and/or in response to a satisfaction of a criterion is desirable. Such a variable logging method (1) maximizes the memory available in the IEDs 120a-e, (2) provides the user 145 with an increased log of monitored characteristic values and/or associated information during events of interest, and (3) does not require an increased frequency in transmitting monitored characteristic values and associated information to the server 110 over the network 130, to name a few advantages.

Figure 2A:
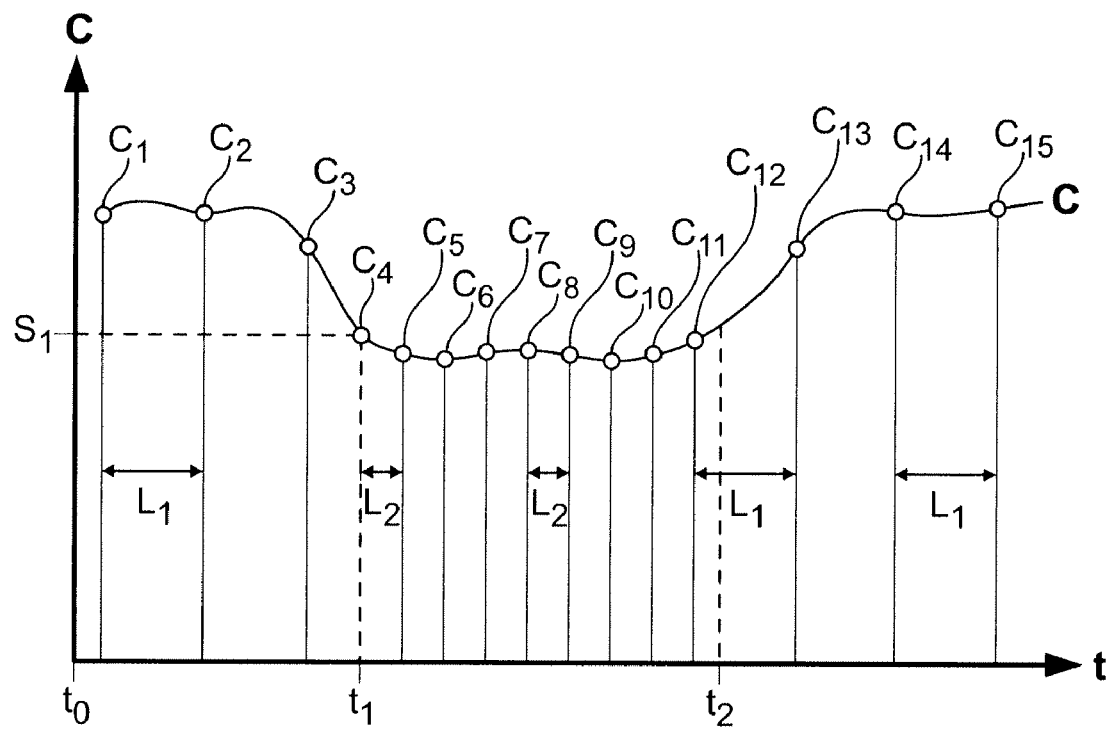
FIG. 2A is a graphical representation of a setpoint value being used to vary a logging interval according to some aspects of the present disclosure.

According to some embodiments, the first IED 120a stores a first monitored characteristic value (e.g., monitored characteristic value $C_1$ of FIG. 2A) of the monitored characteristic values periodically at the first logging interval in the memory of the first IED 120a. In these embodiment, the first IED 120a stores a second monitored characteristic value (e.g., monitored characteristic value $C_4$ of FIG. 2A) of the monitored characteristic values periodically at the second logging interval in the memory of the first IED 120a in response to satisfying a criterion. The IEDs 120a-e can be configured to monitor the same characteristic or different characteristics in the power monitoring system 100. The IEDs 120a-e can be configured to store the respective monitored characteristic values at the same or different first and second logging intervals. For example, the first IED 120a may be configured to store the monitored characteristic values periodically at a first logging interval of fifteen minutes and a second logging interval of one minute, while the fifth IED 120e may be configured to store the monitored characteristic values periodically at a first logging interval of five minutes and a second logging interval of one second.

The second logging interval is distinct from the first logging interval in that the second logging interval is shorter than the first logging interval. Alternatively, the first logging interval can be shorter than the second logging interval. According to some embodiments, the second logging interval is one minute, one second, one tenth of a second, or one hundredth of a second. Other periods or durations of time are contemplated for the second logging interval. According to some embodiments, the first logging interval is at least about five times longer than the second logging interval. According to some embodiments, the first logging interval is at least about three hundred times longer than the second logging interval. According to some embodiments, the second logging interval is equal to the monitoring interval, which is described above.

The criterion can be satisfied based on one or more of: (1) a monitored characteristic value produced periodically at the monitoring interval, (2) one of the monitored characteristic values stored at the first logging interval, (3) one of the monitored characteristic values stored at the second logging interval, and/or (4) the information associated with the monitored characteristic values. The criterion for a particular IED can be satisfied at any time while that IED is producing monitored characteristic values. For example, for a tenth of a second monitoring interval, a five minute first logging interval, and a one-second second logging interval, the first IED $120a$ monitors current and takes current measurements periodically every tenth of a second. While the criterion remains unsatisfied, the first IED $120a$ continues to store one of the current measurements every five minutes at the first logging interval; however, when the criterion is satisfied, the first IED $120a$ immediately begins to store one of the current measurements every second at the second logging interval. Because the criterion can be satisfied based on an instantaneous current measurement produced by the first IED $120a$, the criterion can be satisfied at any time. Thus, after the criterion is satisfied, the first IED $120a$ automatically varies the logging interval from the first logging interval to the second logging interval.

The criterion can include any one or more of a number of predetermined conditions configurable in the IEDs $120a$-$e$, the server $110$, and/or the computer $140$. Referring to FIG. $2A$, a graphical representation of a first setpoint value $S_1$ being used as a condition to varying a logging interval is illustrated. In this example, the criterion includes the condition of the monitored characteristic values being equal to or less than a first setpoint value $S_1$. The monitored characteristic values are represented by the trend line C. The first setpoint value $S_1$ can be any current value selected by the user $145$, preprogrammed in the IEDs $145$, or automatically determined by the IEDs $120a$-$e$ themselves based on information provided by the user $145$. For example, the first setpoint value $S_1$ can be one hundred amps. In this example, the first IED $120a$ stores a first monitored characteristic value $C_1$ of the monitored characteristic values periodically at the first logging interval $L_1$ in response to the monitored characteristic values being greater than one hundred amps.

As shown in FIG. $2A$, $C_1$ to $C_3$ are respectively the first, second, and third stored monitored characteristic values of the buffered monitored characteristic values, which are stored periodically at the first logging interval $L_1$ because their values are greater than one hundred amps. However, the first IEDs $120a$ stores different monitored characteristic values periodically at the second logging interval $L_2$ in response to the buffered monitored characteristic values being equal to or less than one hundred amps. As shown in FIG. $2A$, $C_4$ to $C_{12}$ are respectively the fourth to the twelfth stored monitored characteristic values of the buffered monitored characteristic values, which are stored periodically at the second logging interval $L_2$ because their values are equal to or less than one hundred amps. Comparing the first logging interval $L_1$ with the second logging interval $L_2$ illustrates that first logging interval is longer than the second logging interval. As described above, a variety of ratios between the first and second logging intervals $L_1$ and $L_2$ are contemplated.

The stored monitored characteristic values between time $t_0$ and time $t_1$ are logged periodically at the first logging interval $L_1$. However, the logging interval between the stored monitored characteristic values $C_3$ and $C_4$ is different than the first logging interval $L_1$. Such a shorter logging interval occurred because the produced monitored characteristic value at time $t_1$ is equal to the first setpoint value $S_1$, which satisfied the criterion. Thus, the first logging interval changed to the second logging interval instantaneously, which causes the first IED $120a$ to store an instantaneous monitored characteristic value $C_4$ at time $t_1$.

After the criterion is satisfied, in response to one of the monitored characteristic values produced by the first IED $120a$ being greater than the one hundred amps, the first IED $120a$ varies the logging interval back from the second logging interval $L_2$ to the first logging interval $L_1$. As shown in FIG. $2A$, one of the produced monitored characteristic values is greater than one hundred amps at time $t_2$. Thus, the next monitored characteristic value that the first IED $120a$ logs at the first logging interval $L_1$ is monitored characteristic value $C_{13}$. As shown in FIG. $2A$, $C_{13}$ to $C_{15}$ are monitored characteristic values greater than one hundred amps.

The first setpoint value $S_1$ can be set depending on the application of the particular IED being used in the power monitoring system $100$. The first setpoint value $S_1$ can be any characteristic value. Referring back to the building example described above in reference to the IEDs $120a$-$e$ shown in FIG. $1$, the first IED $120a$ that monitors the incoming electrical service to the entire building can include a first setpoint value of three hundred amps. The second, third, and fourth IEDs $120b$-$d$ that monitor different circuits of a common voltage bus within the building can include respective first setpoint values of one hundred amps, one hundred twenty-five amps, and one hundred thirty amps. The fifth IED $120e$ that monitors a critical electrical circuit for servers in a server room within the building can include a first setpoint value of twenty amps.

According to some embodiments, the criterion includes a setpoint time delay. Thus, for the IEDs $120a$-$e$ to vary the logging interval from the first logging interval $L_1$ to the second logging interval $L_2$ the monitored characteristic values must satisfy the first setpoint value $S_1$ for a predetermined period of time. For example, for a first setpoint value $S_1$ of fifty amps and a time delay of five seconds, the first IED $120a$ will vary the logging interval from the first logging interval $L_1$ to the second logging interval $L_2$ in response to the monitored characteristic values being greater than fifty amps for at least five seconds.

Referring to FIG. $2B$, a graphical representation of setpoint hysteresis being used as a condition to vary a logging interval is illustrated. In this example, the criterion includes the condition of the monitored characteristic values being equal to or greater than a first setpoint value $S_{1a}$. In response to one of the monitored characteristic values satisfying the criterion, that is, one of the monitored characteristic values is equal to or greater than the first setpoint value $S_{1a}$, the first IED $120a$ varies the logging interval from the first logging interval $L_1$ to the second logging interval $L_2$. However, for setpoint hysteresis, the first IED $120a$ only resumes storing one of the monitored characteristic values periodically at the first logging interval $L_1$ in response to one of the monitored characteristic values being less than a second setpoint value $S_{1b}$. For example, for a first setpoint value $S_{1a}$ of one hundred amps and a second setpoint value $S_{1b}$ of ninety amps, the first IED $120a$ will vary the logging interval from the first logging interval $L_1$ to the second logging interval $L_2$ in response to one of the monitored characteristic values being equal to or greater than one hundred amps. However, the first IED 120a will only return the logging interval from the second logging interval $L_2$ to the first logging interval $L_1$ in response to one of the monitored characteristic values being less than ninety amps.

Figure 2B:
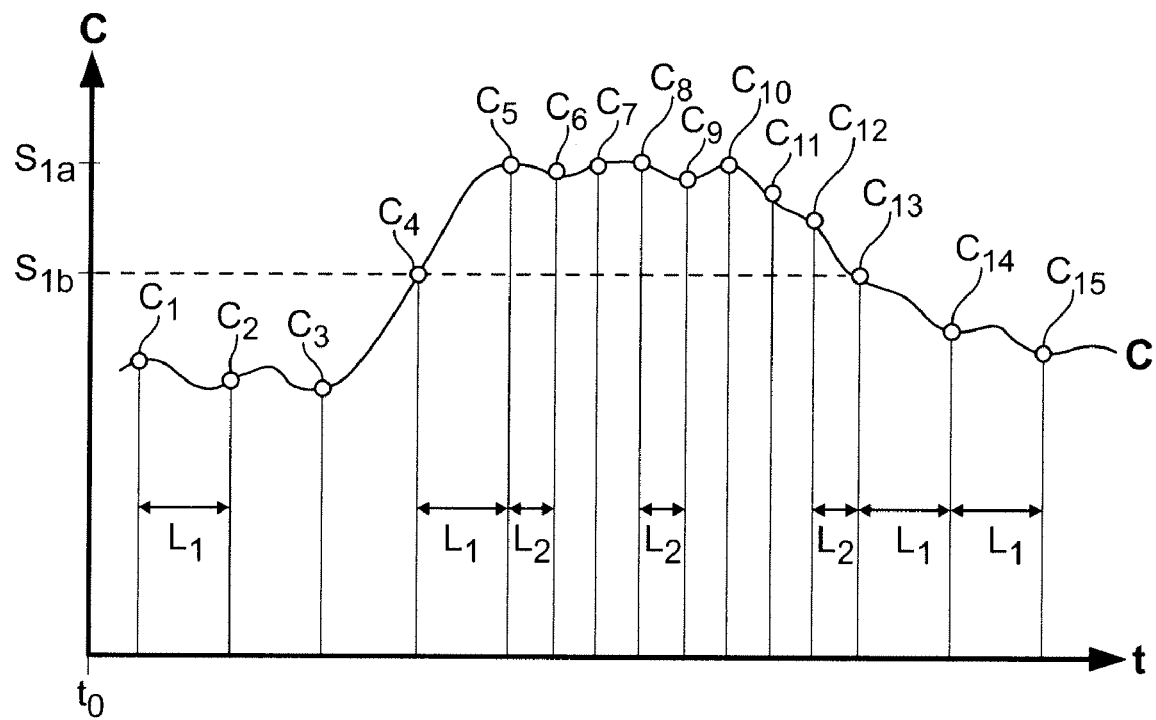
FIG. 2B is a graphical representation of setpoint hysteresis being used to vary a logging interval according to some aspects of the present disclosure.

As shown in FIG. 2B, $C_1$ to $C_4$ are monitored characteristic values stored periodically at the first logging interval $L_1$ because their values are all less than one hundred amps. Monitored characteristic values $C_5$ to $C_{13}$ are stored periodically at the second logging interval $L_2$ because their values are all equal to or greater than ninety amps. Monitored characteristic values $C_{14}$ and $C_{15}$ are stored periodically at the first logging interval $L_1$ because their values are less than ninety amps.

Figure 2C:
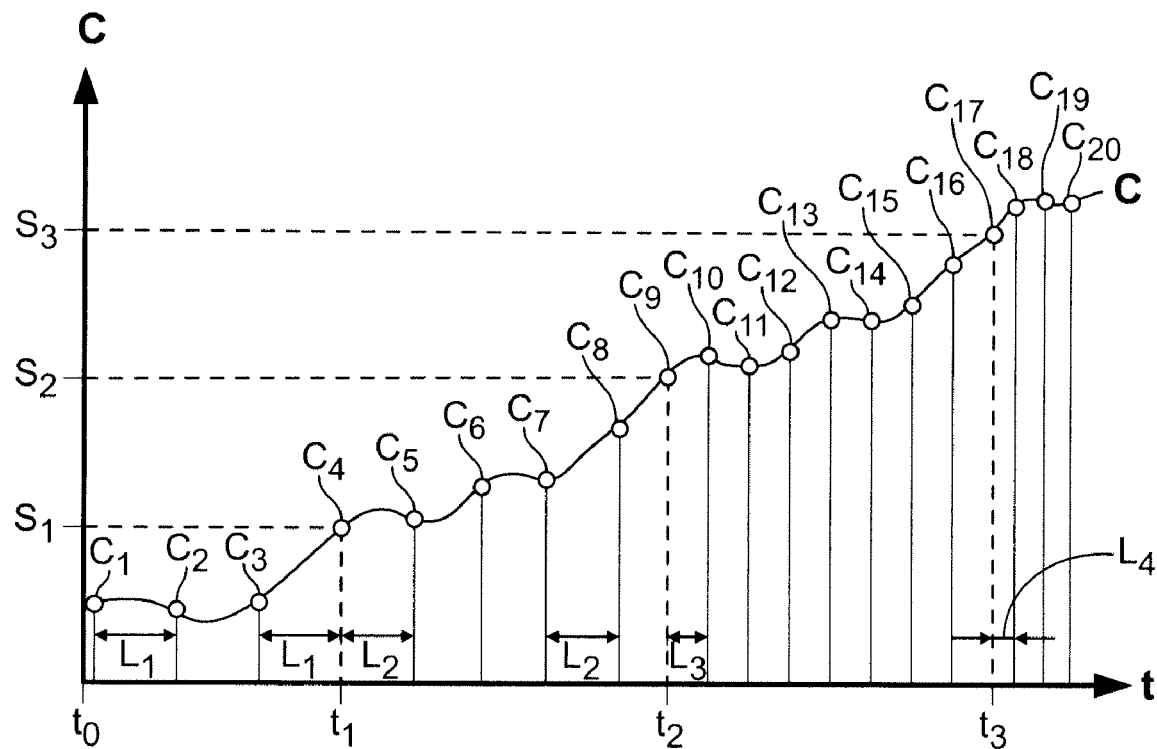
FIG. 2C is a graphical representation of multiple setpoint values being used to vary a logging interval according to some aspects of the present disclosure.

Referring to FIG. 2C, a graphical representation of multiple setpoint values being used as respective conditions to vary a logging interval is illustrated. In this example, corresponding ones of the monitored characteristic values (e.g., $C_1$ to $C_3$) are stored periodically at a first logging interval $L_1$ in response to the monitored characteristic values being less than a first setpoint value $S_1$. A first criterion includes the condition of the monitored characteristic values being equal to or greater than the first setpoint value $S_1$. In response to one of the produced monitored characteristic values satisfying the first criterion, that is, one of the produced monitored characteristic values (e.g., $C_4$) is equal to or greater than the first setpoint value $S_1$, the first IED 120a varies the logging interval from the first logging interval $L_1$ to a second logging interval $L_2$. Similarly, a second criterion includes the condition of the monitored characteristic values being equal to or greater than a second setpoint value $S_2$. In response to one of the produced monitored characteristic values satisfying the second criterion, that is, one of the produced monitored characteristic values (e.g., $C_9$) is equal to or greater than the second setpoint value $S_2$, the first IED 120a varies the logging interval from the second logging interval $L_2$ to a third logging interval $L_3$. Similarly, a third criterion includes the condition of the monitored characteristic values being equal to or greater than a third setpoint value $S_3$. In response to one of the produced monitored characteristic values satisfying the third criterion, that is, one of the produced monitored characteristic values (e.g., $C_{17}$) is equal to or greater than the third setpoint value $S_3$, the first IED 120a varies the logging interval from the third logging interval $L_3$ to a fourth logging interval $L_4$.

As shown in FIG. 2C, $C_1$ to $C_3$ are monitored characteristic values stored periodically at the first logging interval $L_1$ between time $t_0$ and time $t_1$ because their values are all less than the first setpoint value $S_1$. Monitored characteristic values $C_4$ to $C_8$ are stored periodically at the second logging interval $L_2$ between time $t_1$ and time $t_2$ because their values are all equal to or greater than the first setpoint value $S_1$ and less than the second setpoint value $S_2$. Monitored characteristic values $C_9$ to $C_{16}$ are stored periodically at the third logging interval $L_3$ between time $t_2$ and time $t_3$ because their values are equal to or greater than the second setpoint value $S_2$ and less than the third setpoint value $S_3$. Monitored characteristic values $C_{17}$ to $C_{20}$ are stored periodically at the fourth logging interval $L_4$ after time $t_3$ because their values are equal to or greater than the third setpoint value $S_3$. The first, second, third, and fourth logging intervals $L_1$ to $L_4$, respectively, are all distinct from one another. Alternatively, one or more of the logging intervals can be equivalent. For example, in some embodiments, the fourth logging interval $L_4$ can be equivalent to the first logging interval $L_1$. Various other numbers and positions of the setpoint values and sizes of logging intervals are contemplated.

Figure 3:
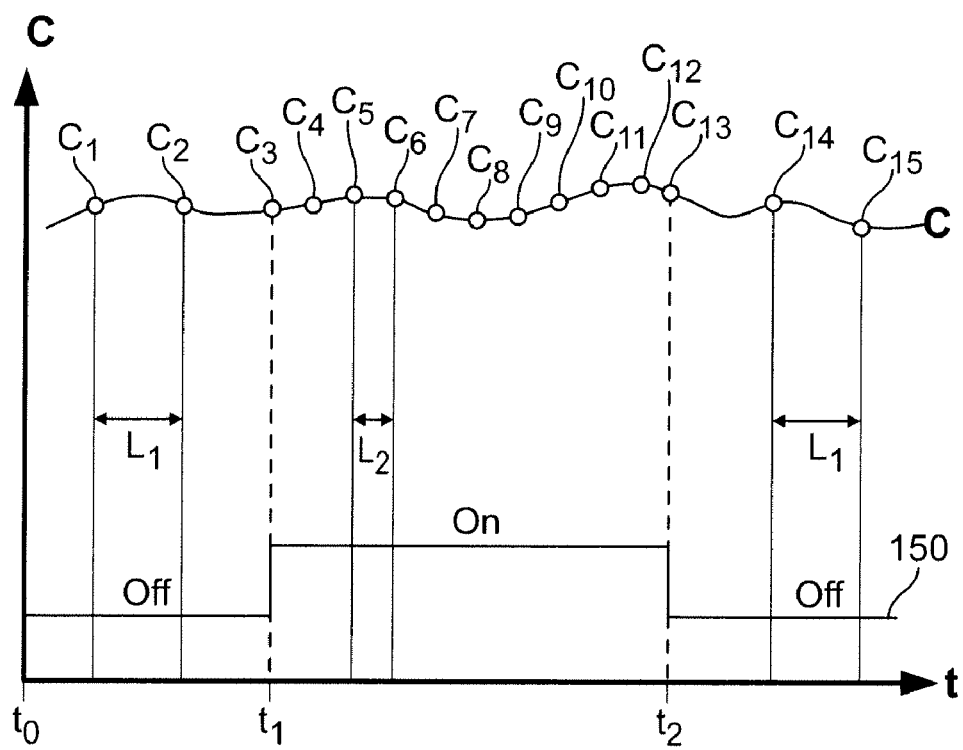
FIG. 3 is a graphical representation of a utility monitoring system status being used to vary a logging interval according to some aspects of the present invention.

Referring to FIG. 3, a graphical representation of utility system status being used as a condition to vary a logging interval is illustrated. In this example, one of the monitored characteristic values (e.g., $C_1$ to $C_3$) is stored periodically at a first logging interval $L_1$ in response to at least a portion of the utility system being in a first status. The utility system can be an electrical utility system being monitored by the power monitoring system 100, and the portion of the utility system can be a circuit breaker. The status can be the on-off status of the circuit breaker and/or the on-off status of an alarm condition of the circuit breaker. Various other types of statuses of a variety of components of the utility system and/or the power monitoring system 100 are contemplated. For example, the status of a signal external to the power monitoring system 100 can be used, such as a price signal from a deregulated energy market.

The criterion includes the condition of the at least a portion of the utility system status changing from the first status to a second status. For example, as shown in FIG. 3, a status 150 of the circuit breaker is shown as being in the first status (e.g., off) between time $t_0$ and time $t_1$. At time $t_1$ the status of the circuit breaker changes to the second status (e.g., on) between time $t_1$ and time $t_2$. And at time $t_2$ the status of the circuit breaker changes back to the first status. In this example, in response to the criterion being satisfied by the status changing to the second status (e.g., on), the first IED 120a varies the first logging interval $L_1$ to a second logging interval $L_2$. Similarly, in response to the status changing back to the first status from the second status, the first IED 120a varies the second logging interval $L_2$ back to the first logging interval $L_1$.

As shown in FIG. 3, $C_1$ to $C_3$ are monitored characteristic values stored periodically at the first logging interval $L_1$ between time $t_0$ and time $t_1$ because their values are stored while the circuit breaker status is off. Monitored characteristic values $C_4$ to $C_{13}$ are stored periodically at the second logging interval $L_2$ between time $t_1$ and time $t_2$ because their values are stored while the circuit breaker status is on. Monitored characteristic values $C_{14}$ and $C_{15}$ are stored periodically at the first logging interval $L_1$ after time $t_2$ because their values are stored while the circuit breaker status is off again. The second logging interval $L_2$ is shorter than the first logging interval $L_1$ to capture more data during an event of interest. In this example, the event of interest is the turning on of the circuit breaker.

Figure 4:
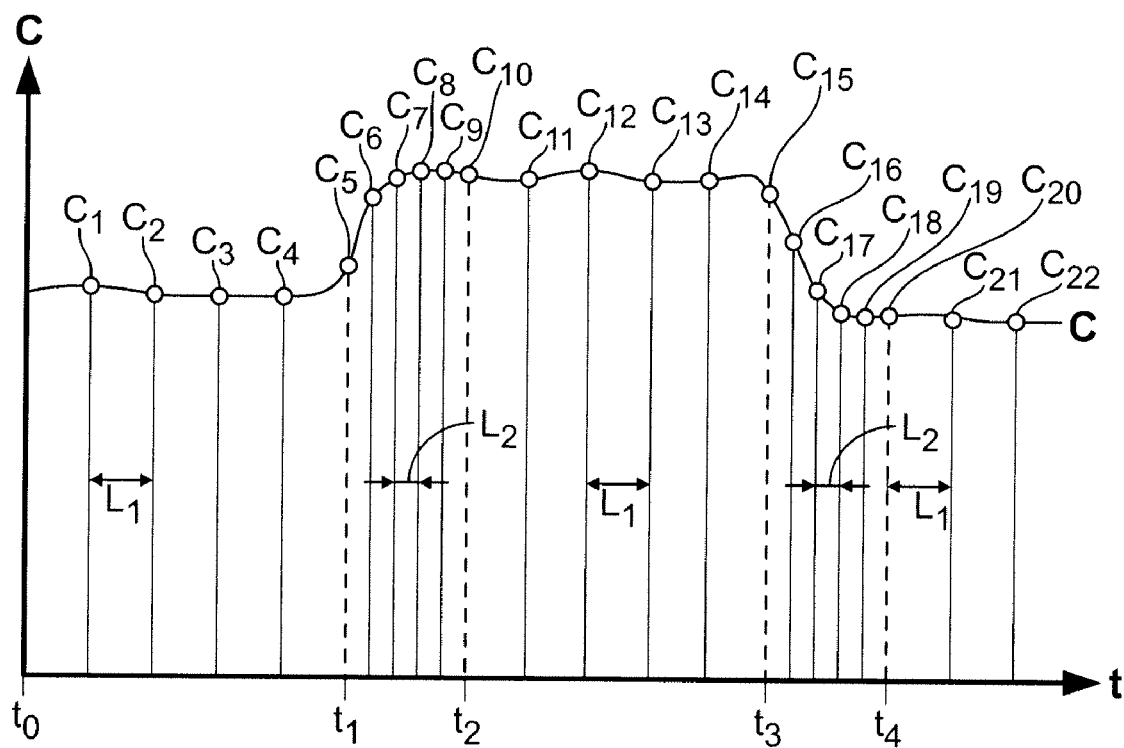
FIG. 4 is a graphical representation of an average monitored characteristic value being used to vary a logging interval according to some aspects of the present invention.

Referring to FIG. 4, a graphical representation of an average monitored characteristic value being used as a condition to vary a logging interval is illustrated. In this example, one of the monitored characteristic values is stored periodically at a first logging interval $L_1$ between time $t_0$ and time $t_1$. The first IED 120a determines an average monitored characteristic value for a portion of the monitored characteristic values stored periodically at the first logging interval. A subsequently produced monitored characteristic value (e.g., $C_5$) is compared with the average monitored characteristic value. The criterion includes the condition of an absolute value of a difference between the average monitored characteristic value and the subsequently produced monitored characteristic value being greater than a predetermined threshold.

The average monitored characteristic value is an average of two to five of the previously produced monitored characteristic values. Alternatively, the average monitored characteristic value can be an average of any number of the previously produced monitored characteristic values (e.g., $C_2$, $C_3$, and $C_4$). The predetermined threshold is between about one amp and twenty amps (e.g., ±0.5 amps). Alternatively, the predetermined threshold can be any predetermined value.

A non-limiting example of an average monitored characteristic value being used as a condition to vary a logging interval includes a predetermined threshold of two amps. For an average monitored characteristic value using three previously produced monitored characteristic values, where the monitored characteristic values $C_2$, $C_3$, and $C_4$ are, respectively, 100.0 amps, 99.5 amps, and 99.0 amps, the average monitored characteristic value is 99.5 amps. The subsequently produced monitored characteristic value $C_5$ is 105 amps. Thus, the absolute value of the difference between the average monitored characteristic value and the subsequently produced monitored characteristic value is 5.5 amps. Because the absolute value of the difference is greater than the predetermined threshold, the criterion is satisfied.

In response to satisfying the criterion, the first IED 120a varies the logging interval from the first logging interval $L_1$ to the second logging interval $L_2$ at time $t_1$. In the above described example shown in FIG. 4, the first IED 120a continues to store one of the monitored characteristic values (e.g., $C_5$ to $C_{10}$) periodically at the second logging interval $L_2$ until the criterion is not satisfied, which occurs at time $t_2$. For example, after the criterion is satisfied as described above, the next stored monitored characteristic value is $C_6$. Because the absolute value of the difference of the monitored characteristic value $C_6$ and the average monitored characteristic value (e.g., average of $C_3$, $C_4$, and $C_5$) continues to satisfy the criterion, the first IED 120a continues to store corresponding produced monitored characteristic values periodically at the second logging interval $L_2$. However, in response to an absolute value of a difference between a later determined average monitored characteristic value (e.g., average of $C_7$, $C_8$, and $C_9$) and a later monitored characteristic value $C_{10}$ being less than the predetermined threshold, the first IED 120a varies the second logging interval $L_2$ back to the first logging interval $L_1$, which occurs at time $t_2$.

Alternatively, at time $t_2$ the first IED 120a can be configured to vary the second logging interval $L_2$ to a third logging interval (not shown) in response to the absolute value of the difference being less than the predetermined threshold. In these alternative embodiments, the third logging interval can be longer than the second logging interval $L_2$ and shorter than the first logging interval $L_1$.

As shown in FIG. 4, $C_1$ to $C_5$ are monitored characteristic values stored periodically at the first logging interval $L_1$ between time $t_0$ and time $t_1$. Monitored characteristic values $C_6$ to $C_{10}$ are stored periodically at the second logging interval $L_2$ between time $t_1$ and time $t_2$. Monitored characteristic values $C_{11}$ to $C_{15}$ are stored periodically at the first logging interval $L_1$ between time $t_2$ and time $t_3$. Between time $t_3$ and time $t_4$ the first IED 120a varies the logging interval back to the second logging interval $L_2$ from the first logging interval $L_1$ because the criterion is satisfied as described above. Similarly, because the criterion is not satisfied at time $t_4$, the first IED 120a varies the logging interval back to the first logging interval $L_1$ after time $t_4$.

Figure 5:
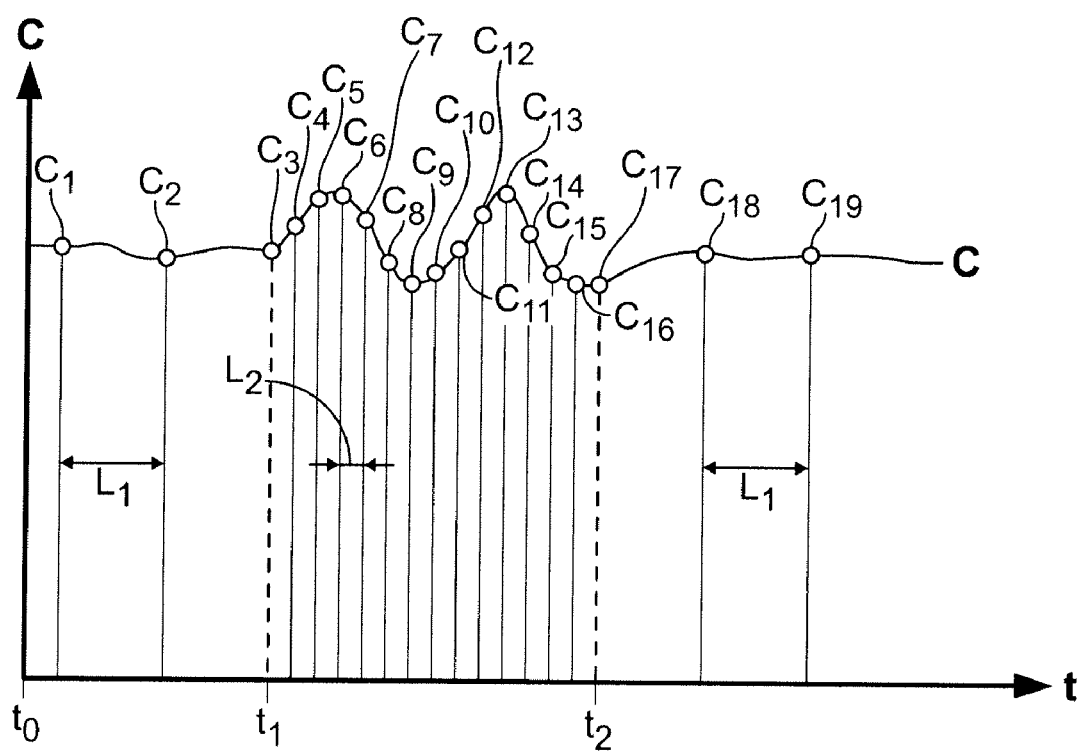
FIG. 5 is a graphical representation of a rate of change of monitored characteristic values being used to vary a logging interval according to some aspects of the present invention.

Referring to FIG. 5, a graphical representation of a rate of change of monitored characteristic values being used to vary a logging interval is illustrated. In this example, one of the monitored characteristic values (e.g., $C_1$ to $C_3$) is stored periodically at a first logging interval $L_1$ between time $t_0$ and time $t_1$. The first IED 120a determines a rate of change of the monitored characteristic values being produced periodically at the monitoring interval described above. The criterion includes the condition of an absolute value of the rate of change of the monitored characteristic values being greater than a predetermined rate of change threshold.

A non-limiting example of a rate of change of monitored characteristic values being used as a condition to vary a logging interval includes a predetermined rate of change threshold of two amps per second. Various other predetermined rate of change thresholds are contemplated. The rate of change of the monitored characteristic values is greater than two amps per second at time $t_1$, which is when the criterion becomes satisfied. Thus, the first IED 120a varies the logging interval from the first logging interval $L_1$ to the second logging interval $L_2$ at time $t_1$. The first IED 120a continues to store corresponding monitored characteristic values periodically at the second logging interval $L_2$ until the criterion is not satisfied. Put another way, until the rate of change of the produced monitored characteristic values is less than the predetermined rate of change threshold, the first IED 120a will continue to store corresponding monitored characteristic values periodically at the second logging interval $L_2$. The criterion becomes unsatisfied at time $t_2$, which is when the rate of change of the monitored characteristic values is less than the predetermined rate of change threshold of two amps per second. Thus, at time $t_2$ the first IED 120a varies the logging interval back to the first logging interval $L_1$ from the second logging interval $L_2$.

As shown in FIG. 5, $C_1$ to $C_3$ are monitored characteristic values stored periodically at the first logging interval $L_1$ between time $t_0$ and time $t_1$ because their values are stored while the rate of change is less than the predetermined rate of change threshold. Monitored characteristic values $C_4$ to $C_{17}$ are stored periodically at the second logging interval $L_2$ between time $t_1$ and time $t_2$ because their values are stored while the rate of change is greater than the predetermined rate of change threshold. Monitored characteristic values $C_{18}$ and $C_{19}$ are stored periodically at the first logging interval $L_1$ after time $t_2$ because their values are stored while the rate of change is less than the predetermined rate of change threshold. The second logging interval $L_2$ is shorter than the first logging interval $L_1$ to capture more data during the high rate of changes of the monitored characteristic values.

According to some embodiments, monitored characteristic values are stored periodically at a first logging interval $L_1$ in response to an available amount of memory in an IED being less than a predetermined threshold. The IED automatically varies the logging interval from the first logging interval $L_1$ to a second logging interval $L_2$ in response to satisfying a criterion. The criterion includes the condition of the available amount of memory in the IED being equal to or greater than the predetermined memory threshold. The first logging interval $L_1$ is longer than the second logging interval $L_2$ to conserve memory in the IED. The varying of the logging interval based on available memory can be used in lieu of or in combination with any of the aforementioned criteria for varying the logging interval.

According to some embodiments, monitored characteristic values are stored periodically at a first logging interval $L_1$ in response to a time of day criterion. The IED automatically varies the logging interval from the first logging interval $L_1$ to a second logging interval $L_2$ in response to satisfying the time of day criterion. For example, the IED stores monitored characteristic values periodically at a first logging interval between 6:00 AM and 6:00 PM and stores monitored characteristic values periodically at a second logging interval between 6:00 PM and 6:00 AM. For another example, the IED stores monitored characteristic values periodically at a first logging interval between 6:00 AM and 1:00 PM; stores monitored characteristic values periodically at a second logging interval between 1:00 PM and 8:00 PM; and stores monitored characteristic values periodically at a third logging interval between 8:00 PM and 6:00 AM. The first, the second, and the third logging intervals can be any of a variety of periods or durations. The varying of the logging interval based on a time of day criterion can be used in lieu of or in combination with any of the aforementioned criteria for varying the logging interval.

As described above, the logging interval of the monitored characteristic values varies in response to satisfying a criterion. Thus, merely comparing a time stamp of consecutively stored and transmitted monitored characteristic values does not indicate missing data. According to some embodiments, the power monitoring system 100 includes an incremental counter system. The incremental counter system tags an incremental counter to each of the stored monitored characteristic values that are stored periodically at the first logging interval and at the second logging interval in the memory of the IEDs 120a-e. Each of the stored monitored characteristic values is tagged with an incremental counter value starting with a value of one. The incremental counter system is useful when the IEDs 120a-e transmit stored monitored characteristic values and/or associated information over the network 130 to the server 110. In these embodiments, some of the stored monitored characteristic values and/or associated information can be lost during the transmission over the network 130. Thus, a comparison of the incremental counter values allows the user 145 to quickly determine if monitored characteristic values and/or associated information is missing and approximately how much is missing, if any.

The user 145 can view the transmitted monitored characteristic values on the computer 140 via a display in a graphical representation as shown in FIGS. 2A-2C and 3 to 5, or in a table. A comparison between any two consecutive monitored characteristic values can be used to determine if any of the stored monitored characteristic values are missing because the difference between two consecutive counters should equal one. For example, referring back to FIG. 2A, the first stored monitored characteristic value is $C_1$, which is tagged with a counter value of one. Similarly, an incremental counter value of two is tagged to the second monitored characteristic value $C_2$, which was stored periodically at the first logging interval $L_1$. Additionally, incremental counter values of three, four, and five are tagged to the third, fourth, and fifth monitored characteristic values $C_3$, $C_4$, and $C_5$, respectively. Comparing the incremental counter values of any two consecutive of the first to fifth monitored characteristic values indicates that no logged data is missing. If, however, a comparison of two of the consecutively stored monitored characteristic values results in value other than one, then an error signal is displayed to indicate that one or more stored monitored characteristic values may be missing. The error signal can be displayed on the IEDs 120a-e, the server 110, and/or the computer 140.

Figure 6:
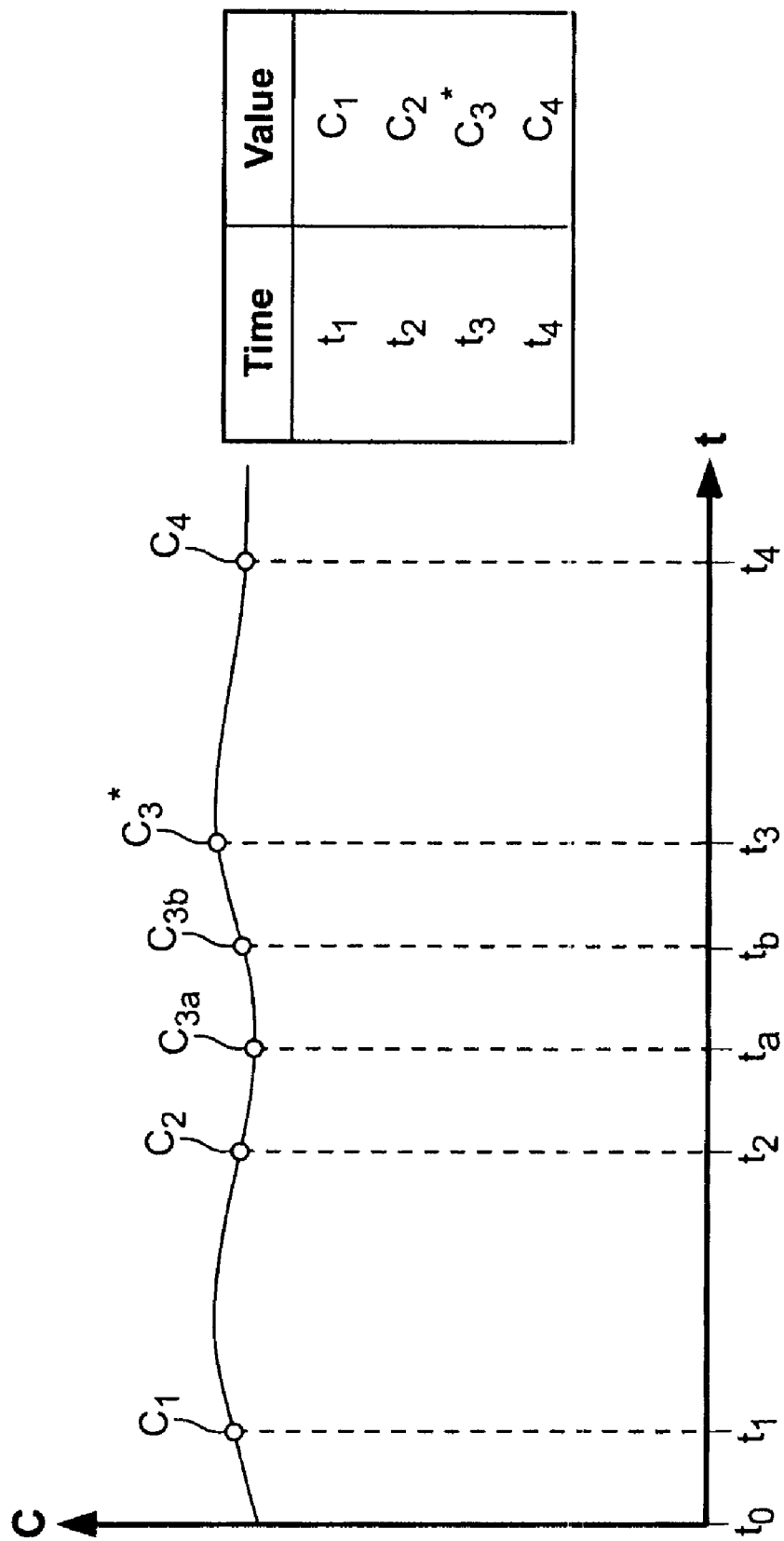
FIG. 6 is a graphical representation of monitored characteristic values being displayed at a fixed interval of time and a corresponding chart according to some aspects of the present invention.

Referring to FIG. 6, a graphical representation of monitored characteristic values being displayed at a fixed interval of time and a corresponding chart are illustrated. As described above, the first IED 120a monitors current and produces monitored characteristic values, which are stored periodically at a first logging interval or at a second logging interval in the memory of the first IED 120a depending on whether a criterion is satisfied. Thus, the first IED 120a stores monitored characteristic values at two or more logging intervals depending on the criterion and/or configuration of the first IED 120a. As shown in FIG. 6, the first, second, and fifth monitored characteristic values $C_1$, $C_2$, and $C_4$ are monitored characteristic values stored periodically at the first logging interval $L_1$. The third and fourth monitored characteristic values $C_{3a}$ and $C_{3b}$ are monitored characteristic values stored periodically at the second logging interval $L_2$. To maintain a linear time scale when presenting the stored monitored characteristic values, the computer 140 generates a summary value $C_3^*$, which summarizes and/or averages the monitored characteristic values $C_{3a}$ and $C_{3b}$ stored at the second shorter logging interval $L_2$ with a single current measurement. When displaying such a summary value, the summary value can be indicated with an asterisk or other indicia on the displayed graph or in an associated chart, as shown in FIG. 6. According to some embodiments, the summary value can also include additional information about the summarized monitored characteristic values including, but not limited to, a maximum monitored characteristic value, a minimum monitored characteristic value, a mode monitored characteristic value, a standard deviation, a number of values summarized, and a confidence interval.

According to some embodiments, the first IED 120a stores monitored characteristic values in the memory of the first IED 120a at two or more logging intervals. The first IED 120a transmits the stored monitored characteristic values to the server 110 over the network 130. The computer 140 and/or the user 145 selects a range of stored monitored characteristic values to display in a graphical representation. The computer 140 determines the largest or longest logging interval among the selected monitored characteristic values and uses that logging interval as a standard time interval between displayed monitored characteristic values. In some embodiments, the standard interval is equal to the first logging interval, which is the largest logging interval. For each group of stored monitored characteristic values at a logging interval shorter or smaller than the standard time interval the computer 140 generates a summary value for the group to be displayed instead of the actual monitored characteristic values. Such a method allows for a linear graphical representation without displaying a plurality of monitored characteristic values within one of the standard intervals of the graphical representation, which may lead to overcrowding of the monitored characteristic values and associated information in a linear graphical representation.

According to some embodiments, the first IED 120a monitors a characteristic (e.g., current) and produces monitored characteristic values that are buffered in the first IED 120a. Depending on whether a criterion is satisfied, the first IED 120a stores monitored data periodically at one or more logging intervals in a memory of the IED. For example, if the criterion is not satisfied, the first IED 120a stores first monitored data in the memory periodically at a first logging interval. Yet, when the criterion is satisfied, the first IED 120a stores second monitored data in the memory periodically at a second logging interval. The first and the second monitored data is associated with the buffered monitored characteristic values. In some embodiments, the monitored data includes one or more of the buffered monitored characteristic values. In some embodiments, the monitored data includes average values, maximum values, and/or minimum values of the buffered monitored characteristic values for a particular logging interval. According to some embodiments, the monitored data includes one or more buffered monitored characteristic values and one or more of the average, maximum, or minimum values discussed above. As described above, the first and the second logging intervals are distinct and can be any ratio of durations or time.

Any of the methods described herein can include machine readable instructions for execution by: (a) a processor, (b) a controller, and/or (c) any other suitable processing device. It will be readily understood that the IEDs 120a-e, the server 110, and/or the computer 140 can include such a suitable processing device. Any algorithm, software, or method disclosed herein can be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well known manner (e.g., it may be implemented by an application specific integrated circuit (ASIC), a programmable logic device (PLD), a field programmable logic device (FPLD), discrete logic, etc.). Also, some or all of the machine readable instructions represented in any flowchart depicted herein may be implemented manually. Further, although specific algorithms are described with reference to flowcharts depicted herein, persons of ordinary skill in the art will readily appreciate that many other methods of implementing the example machine readable instructions may alternatively be used. For example, the order of execution of the blocks may be changed, and/or some of the blocks described may be changed, eliminated, or combined.

Words of degree such as "substantially" or "about" are used herein in the sense of "at, or nearly at, given the process, control, and material limitations inherent in the stated circumstances" and are used herein to keep the unscrupulous infringer from taking advantage of unqualified or absolute values stated for exemplary embodiments.

While particular aspects, embodiments, and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A method of storing data in a utility monitoring system, comprising:
    monitoring a characteristic of a utility system in an intelligent electronic device (IED) to produce monitored characteristic values that are buffered in the IED, the IED being communicatively coupled to a server via a network, the monitored characteristic values being indicative of the characteristic;
    storing a first set of monitored characteristic values of the buffered monitored characteristic values at a first logging interval in a memory of the IED such that each of the stored values of the first set of monitored characteristic values is stored according to a first storing frequency;
    determining that a criterion associated with the monitored characteristic is satisfied;
    in response to the determining that the criterion is satisfied, varying the first logging interval to a second logging interval; and
    storing a second set of monitored characteristic values of the buffered monitored characteristic values at the second logging interval in the memory of the IED in response to the varying such that each of the stored values of the second set of monitored characteristic values is stored according to a second storing frequency that is distinct from the first storing frequency.

2. The method of claim 1, further comprising storing an average logging interval characteristic value, a maximum logging interval characteristic value, or a minimum logging interval characteristic value along with the stored first set of monitored characteristic values and the stored second set of monitored characteristic values of the buffered monitored characteristic values.

3. The method of claim 1, wherein the buffered monitored characteristic values are produced periodically at a monitoring interval.

4. The method of claim 3, wherein the monitoring interval is equal to the second logging interval.

5. The method of claim 3, further comprising in the IED:
    determining an average monitored characteristic value for a portion of the buffered monitored characteristic values produced periodically at the monitoring interval; and
    comparing the determined average monitored characteristic value with a subsequently buffered monitored characteristic value,
    wherein the criterion includes an absolute value of a difference between the determined average monitored characteristic value and the subsequently buffered monitored characteristic value being greater than a predetermined threshold.

6. The method of claim 5, responsive to the criterion being satisfied, the method further comprising storing a third set of monitored characteristic values of the buffered monitored characteristic values in response to an absolute value of a difference between an average monitored characteristic value of a portion of the buffered monitored characteristic values produced periodically at the monitoring interval and a subsequently buffered monitored characteristic value being less than the predetermined threshold, the third set of monitored characteristic values being stored at the first logging interval in the memory of the IED such that each of the stored values of the third set of monitored characteristic values is stored according to the first storing frequency.

7. The method of claim 1, wherein the utility system is an electrical utility system and the characteristic is current, voltage, or power.

8. The method of claim 1, wherein the utility system is a gas utility system, a water utility system, an air utility system, or a steam utility system.

9. The method of claim 1, wherein the first logging interval is at least about five times longer than the second logging interval.

10. The method of claim 1, wherein the first logging interval is at least about three hundred times longer than the second logging interval.

11. The method of claim 1, wherein the storing the first set of monitored characteristic values of the buffered monitored characteristic values at the first logging interval is responsive to the buffered monitored characteristic values being greater than a first setpoint value and the satisfaction of the criterion includes the buffered monitored characteristic values being equal to or less than the first setpoint value.

12. The method of claim 11, further comprising storing a third set of monitored characteristic values of the buffered monitored characteristic values in response to the buffered monitored characteristic values being equal to or less than a second setpoint value, the second setpoint value being less than the first setpoint value, the third set of monitored characteristic values being stored at a third logging interval in the memory of the IED such that each of the stored values of the third set of monitored characteristic values is stored according to a third storing frequency that is distinct from the first and the second storing frequencies.

13. The method of claim 1, wherein the storing the first set of monitored characteristic values of the buffered monitored characteristic values at the first logging interval is responsive to the buffered monitored characteristic values being less than a first setpoint value and the criterion includes setpoint hysteresis.

14. The method of claim 1, wherein the storing the first set of monitored characteristic values of the buffered monitored characteristic values at the first logging interval is responsive to at least a portion of the utility monitoring system being in a first status and the criterion includes a change of the first status to a second status of the at least a portion of the utility monitoring system.

15. The method of claim 14, wherein the at least a portion of the utility monitoring system is a power monitoring device and the first status includes an alarm signal being off and the second status includes the alarm signal being on.

16. The method of claim 1, further comprising determining a rate of change of the buffered monitored characteristic values, the criterion including an absolute value of the rate of change of the buffered monitored characteristic values being greater than a predetermined rate of change threshold.

17. The method of claim 1, wherein the criterion includes an available amount of the memory in the IED being equal to or greater than a predetermined memory threshold.

18. The method of claim 1, further comprising:
tagging an incremental counter to each of the stored monitored characteristic values of the first and the second sets of monitored characteristic values; and
displaying an error signal when a difference between consecutive incremental counters fails to equal a predetermined amount.

19. The method of claim 1, wherein the determining that the criterion associated with the monitored characteristic is satisfied occurs instantaneously with the monitoring the characteristic, and wherein the storing the second set of monitored characteristic values at the second logging interval is carried out automatically in response to the criterion being satisfied.

20. The method of claim 19, wherein the storing the first set of monitored characteristic values of the buffered monitored characteristic values at the first logging interval is responsive to the buffered monitored characteristic values being greater than a first setpoint value and the criterion includes (i) the buffered monitored characteristic values being equal to or less than the first setpoint value, (ii) setpoint hysteresis, or both (i) and (ii).

21. A method of displaying data stored at variable frequencies, the method comprising:
monitoring a characteristic of a utility system in an intelligent electronic device (IED) to produce monitored characteristic values periodically at a monitoring interval, the produced monitored characteristic values being buffered in the IED, the IED being communicatively coupled to a server via a network, the monitored characteristic values being indicative of the characteristic;
storing a first set of monitored characteristic values of the monitored characteristic values at a first logging interval in a memory of the IED such that each of the stored values of the first set of monitored characteristic values is stored according to a first storing frequency;
determining that a criterion associated with the monitored characteristic is satisfied;
in response to the determining that the criterion is satisfied, varying the first logging interval to a second logging interval;
storing a second set of monitored characteristic values of the monitored characteristic values at the second logging interval in the memory of the IED in response to the varying such that each of the stored values of the second set of monitored characteristic values is stored according to a second storing frequency that is distinct from the first storing frequency;
transmitting the stored first and second sets of monitored characteristic values to the server via the network; and
displaying a graphical representation of the stored first and second sets of monitored characteristic values at a fixed interval of time.

22. The method of claim 21, wherein the fixed interval of time is equal to the first logging interval.

23. A method of storing data in a utility monitoring system, comprising:
monitoring a characteristic of a utility system in an intelligent electronic device (IED) to produce monitored characteristic values that are buffered in the IED, the IED being communicatively coupled to a server via a network, the monitored characteristic values being indicative of the characteristic;
storing a first set of monitored characteristic values of the buffered monitored characteristic values at a first logging interval in a memory of the IED in response to the buffered monitored characteristic values being less than a first setpoint value; and
storing a second set of monitored characteristic values of the buffered monitored characteristic values at a second logging interval in the memory of the IED in response to satisfying a criterion, the second logging interval being distinct from the first logging interval, the criterion including setpoint hysteresis.

24. The method of claim 23, further comprising determining that the criterion is satisfied and in response to the determining, varying the first logging interval to the second logging interval.

* * * * *